United States Patent

[11] 3,584,266

[72] Inventor Harald Schilling
Gundelfingen, Germany
[21] Appl. No. 826,146
[22] Filed May 20, 1969
[45] Patented June 8, 1971
[73] Assignee International Telephone and Telegraph Corporation
Nutley, N.J.
[32] Priority May 30, 1968
[33] Germany
[31] P 17 64 398.0

[54] DEPLETION LAYER CAPACITOR IN PARTICULAR FOR MONOLITHIC INTEGRATED CIRCUITS
4 Claims, 4 Drawing Figs.

[52] U.S. Cl. .......... 317/234, 317/235
[51] Int. Cl. .......... H01l 5/00
[50] Field of Search .......... 317/234/9, 235/48, 235/48.1

[56] References Cited
UNITED STATES PATENTS

| | | | |
|---|---|---|---|
| 3,404,295 | 10/1968 | Warner, Jr. | 317/235X |
| 3,427,479 | 2/1969 | Chauny et al. | 317/235X |
| 3,449,643 | 6/1969 | Imaizumi | 317/235 |
| 3,474,308 | 10/1969 | Kronlage | 317/235 |
| 3,514,846 | 6/1970 | Lynch | 317/234X |

OTHER REFERENCES
Defensive Pulication, Application 769,261, filed Oct. 21, 1968, Published April 29, 1969. Class 317/235

*Primary Examiner*—Janes D. Kallam
*Attorneys*—C. Cornell Remsen, Jr., Walter J. Baum, Paul W. Hemminger, Percy P. Lantzy, Isidore Togut, Philip M. Bolton and Charles L. Johnson, Jr.

ABSTRACT: This is a depletion layer capacitor which can be simultaneously formed with other planar transistors on a monolithic integrated circuit. The depletion layer capacitor achieves a high voltage breakdown by producing a PN junction which joins two highly doped regions of opposite conductivity type wherein said junction is established within an epitaxial layer of lower impurity concentration and doesn't extend to the surface of said epitaxial layer.

INVENTOR

HARALD SCHILLING

BY

ATTORNEY

INVENTOR

HARALD SCHILLING

BY Isidore Togut

ATTORNEY

DEPLETION LAYER CAPACITOR IN PARTICULAR FOR MONOLITHIC INTEGRATED CIRCUITS

BACKGROUND OF THE INVENTION

This invention relates to depletion layer capacitors, in particular for monolithic integrated circuits.

It is known to utilize the space charge capacitance of PN junction areas as depletion layer capacitors. In this connection it is generally known to use varactor diodes and depletion layer capacitors as individual elements in monolithic integrated circuits. From the article "Die Planartechnik bei Transistoren und integrierten Schaltungen" (Planar technique as applied to transistors and IC's) as published in "Scientia Electrica" volume X, No. 4 (1964), pp. 97 to 122, it is also known to use the depletion layer of either the emitter-base or the collector-base junction of a discrete planar transistor in singular or parallel arrangement, or an integrated circuit, as a capacitor.

In the simplest case of a depletion layer capacitor having one electrode applied to the substrate, or base body or wafer of the integrated circuit, a region or zone is produced in the semiconductor wafer by using the well-known planar diffusion method. It is also known in monolithic integrated circuits, to produce a depletion layer capacitor having two zones electrically insulated from the substrate or wafer by a PN junction area. Such a depletion layer capacitor is accommodated in a zone within the surface of a layer attached to the wafer and has a conductivity of the type which is in opposition to that of the wafer. This layer can be an epitaxially grown layer. The zone within the surface, in which the depletion layer capacitor is accommodated is established with respect of having either a lower breakdown voltage in cases where a high depletion layer capacity is required, or require a large surface to the remaining semiconductor elements of the integrated circuit, by having an isolating ring zone extend from the substrate to the surface of the epitaxial layer.

Known types of depletion layer capacitors have the disadvantage of having either a lower breakdown voltage in cases where a high depletion layer capacity is required, or require a large surface area. If a highly doped surface zone, such as the emitter zone of a planar transistor, is used with respect to the adjoining base zone as a depletion layer capacitor then there is obtained a relatively high specific capacity i.e. capacity per surface unit, due to the high doping concentration. Owing to the high doping concentrations, however, there will result a relatively low breakdown voltage of the depletion layer capacitor, restricting the operating voltage thereof to a few volts.

SUMMARY OF THE INVENTION

It is the object of the present invention to provide a structure for a depletion layer capacitor having a relatively high breakdown voltage and a high specific capacity.

Another object is to produce a depletion layer capacitor following the steps of production used for manufacturing semiconductor elements, in particular planar transistor elements.

According to a broad aspect of the invention there is provided a depletion layer capacitor, in particular for a monolithic integrated circuit, comprising a region formed within one surface of an epitaxial layer, said region having the same conductivity as and a higher doping concentration than said layer, the other surface of said layer being attached to a wafer, said layer having a conductivity type which is in opposition to that of said wafer, and a partial zone having the conductivity type of said wafer extending from said wafer to said region forming a PN junction with said region.

DESCRIPTION OF THE PREFERRED EMBODIMENTS

Figure 1:
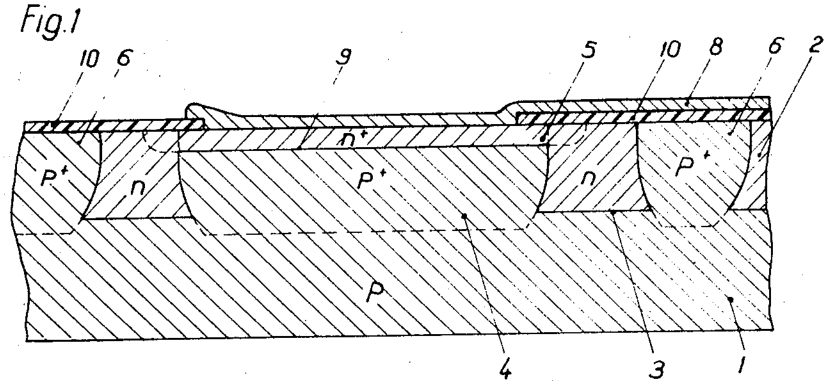
FIG. 1 shows an embodiment of the invention as a section of a monolithic integrated circuit, in a cross-sectional view taken along line A–A of FIG. 2.

The depletion layer capacitor according to the present invention, has an enlarged specific capacity and consequently, a smaller space requirement on the surface of the semiconductor, and can be conveniently manufactured within a monolithic integrated circuit, since all of the regions necessary for establishing the capacitor can be compatibly established with the regions of other semiconductor devices within the same integrated circuit. In the examples of embodiment, it is assumed that the integrated circuit comprises at least one planar transistor having a collector zone thereof formed from a portion of an epitaxial layer, said layer being disposed on a wafer of opposite conductivity type. The transistor is electrically isolated with respect to the remaining semiconductor devices within the integrated circuit by a ring zone extending through the epitaxial layer which acts as an isolating zone and has the same conductivity type as the wafer. The manufacture of a depletion layer capacitor according to the present invention can thus be carried out simultaneously with the making, deposition and diffusion steps necessary for producing a transistor without requiring any additional working steps. Therefore, in describing the embodiments of this invention we refer to an emitter or base region diffusion whenever describing a diffusion process for manufacturing the depletion layer capacitor according to the invention.

In order to obtain a high specific capacity, i.e. a small surface requirement of a depletion layer capacitor with a PN junction which is determinative of the capacitance, it is necessary that the doping concentration of the two regions constituting the PN junction be as high as possible. The regions constituting the emitter base junction of a planar transistor are composed of a highly doped and low resistive semiconductor material. Since the emitter base junction of a planar transistor has a breakdown voltage of only a few volts, the depletion layer capacitors, formed from such an emitter base junction whose corresponding regions are diffused into the semiconductor body common to all of the semiconductor devices of the integrated circuit, have the disadvantage of having a maximum operating voltage of only a few volts.

Since the isolating ring regions 6, as shown in the drawings, electrically isolating the semiconductor devices of the integrated circuit, have a very high doping concentration, it is possible to form them while forming one of the highly doped regions which will be part of the depletion layer capacitor. In proceeding from this basic idea we will obtain the depletion layer capacitors according to the present invention which have a higher breakdown voltage and a smaller surface of space requirement than the emitter-base junctions of corresponding planar transistors.

Figure 2:
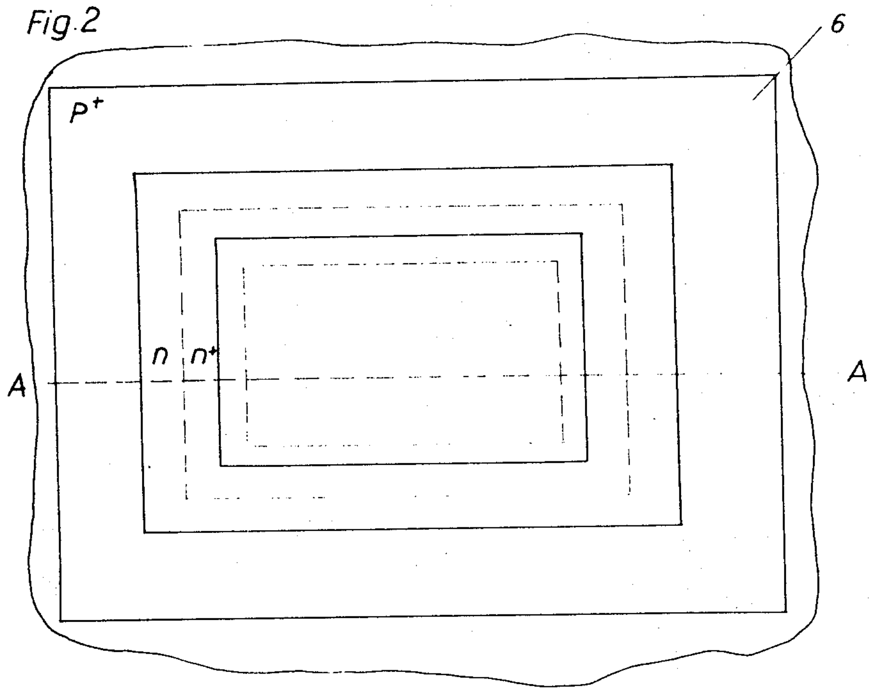
FIG. 2 shows the top view of the embodiment shown in FIG. 1.

In the example of embodiment according to FIGS. 1 and 2, in accordance with the method of manufacturing monolithic integrated circuits, we start out with a plate-shaped semiconductor wafer 1, which has an epitaxial layer attached thereto, said epitaxial layer 2 has a conductivity type opposite to that of the wafer 1, thus forming the PN junction surface 3. We then diffuse into the epitaxial layer 2 the isolating zones of the integrated circuit together with isolating rings 6 using the planar technique, said isolating zones and rings 6 extend from the surface of the epitaxial layer to the wafer 1 and have the same conductivity type as said wafer. The doping concentration of the isolating ring 6 is greater than the doping concentration for wafer 1. Partial zone 4 has the same conductivity type and approximate doping concentration as the isolating zones and the ring zone 6, when producing the depletion layer capacitor according to the present invention. The partial zone 4 is diffused through a window in an oxide layer at the surface of the layer 2 to wafer 1 by will result the masking, photolithographic and diffusion techniques. Subsequently thereto, the diffusion window of the partial zone 4 is enlarged, and the surface region 5 is diffused in such a manner as to extend past the outer periphery of the partial zone 4. Surface region 5 corresponds to the emitter regions of the other planar transistor elements within the integrated circuit. The diffusion of this surface region 5 can be performed simultaneously with the diffusion of the emitter regions of the planar transistors of the integrated circuit and, consequently, will have a higher surface doping concentration than the epitaxial layer. Accordingly, there will result the N -$P^+$-junction 9 which determines the breakdown voltage and, consequently, the maximum operating voltage of the depletion layer capacitor. Since this junction does not reach or extend to the semiconductor surface, it is protected against surface damage thereby resulting in improving the breakdown voltage of a PN junction formed from two highly doped adjacent regions. The one electrode 8 of the depletion layer capacitor, contacts the surface region 5 through a hole in the masking oxide layer 10. The other electrode can be applied to that surface of wafer 1 opposite the surface attached to the epitaxial layer.

From the bulging of the PN junction area of the depletion layer capacitor according to FIG. 1 there results additionally a further enlargement of the specific capacity.

FIG. 2, in a top view, shows the depletion layer capacitor according to FIG. 1. For the sake of clarity, the electrode 8 has been omitted. In the drawings the effective PN junction surface is indicated by a through-going solid line.

For the example given in FIGS. 1 and 2, let us assume that wafer 1 is P conductivity type, epitaxial layer 2 is N conductivity type, partial zone 4 and ring zone 6 are P+ conductivity type, and surface region 5 is N+ conductivity type.

Figure 3:
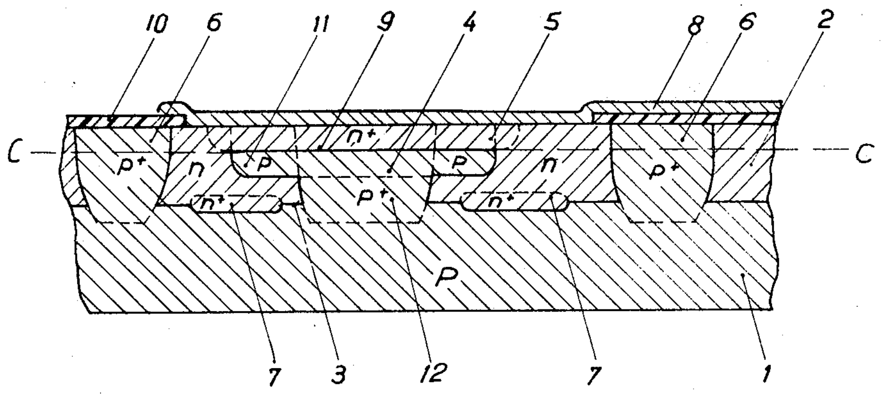
FIG. 3 shows another embodiment of the present invention in the form of a section of a monolithic integrated circuit, in a sectional view along line B–B of FIG. 4.
Figure 4:
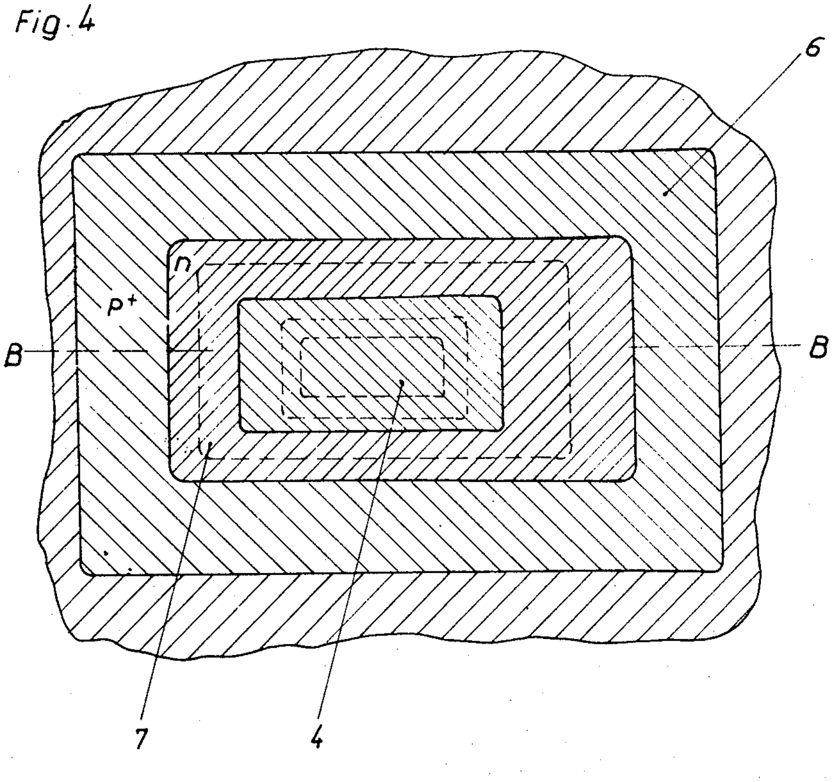
FIG. 4 shows a section of FIG. 3 taken along line C–C.

FIGS. 3 and 4 show a further type of embodiment of a depletion layer capacitor according to the present invention which can be manufactured in a monolithic integrated circuit. This depletion layer capacitor differs from the one according to FIGS. 1 and 2 by the mushroom-shape of the partial zone 4 and by an additional semiconductor layer 7. This additional layer 7 has a higher doping concentration than, and the same conductivity type as the epitaxial layer 2. Let us assume that layer 7 is N+ conductivity type for the examples given in this application. This additional semiconductor layer 7 serves to reduce the lead-in resistance from the "stem" 12 of the mushroom-shaped region towards the contact electrode 8. The additional layer 7 is produced in the conventional way by planar diffusion into wafer 1 prior to the application of the epitaxial layer 2, wherein layer 7 may ultimately encircle "-stem" 12. A layer of the same type as layer 7 is also used in planar transistor elements in which all zones are contacted on one surface side of the semiconductor body.

In the depletion layer capacitor according to FIGS. 3 and 4, the same diffusion process required for producing the base zone of a planar transistor element is used for the purpose of enlarging the PN junction surface as shown by the "hat" or platform portion 11 of partial zone 4 in FIG. 3.

In the embodiment shown in FIG. 3, the "stem" portion 12 of partial zone 4 can be diffused simultaneously with ring zone 6 thus forming respective P+ regions. The "hat" or platform portion 11 is then diffused through a suitably dimensioned mask at the surface of layer 2 so as to overlap the stem. This diffusion step for the formation of the "hat" can take place simultaneously with the formation of the base regions of the other planar transistors positioned on the integrated circuit wafer or slice. Let us assume for the examples given that the "-hat" or platform portion 11 has a P conductivity of a lower doping concentration than the "stem" 12. Thereupon, just as in the example of the embodiment according to FIG. 1, the surface zone 5 is diffused through an appropriate mask at the surface of layer 2 which overlaps the "hat" or platform portion 11 of the mushroom-shaped partial zone 4 as shown in FIG. 3. Again, surface region 5 can be simultaneously diffused with the emitter regions of the planar transistors of the monolithic slice. The doping concentration of the adjoining regions are the same as they were in the device indicated in FIGS. 1 and 2 with the addition of the P conductivity type "-hat" or platform portion, P+ conductivity type stem portion and N+ conductivity type additional layer 7. Again, however, the maximum admissible operation voltage of the device is determined by the breakdown voltage of the $P^+$-$N^+$-junction between the surface zone 5 and the partial zone 4.

In the above examples we describe the lease expensive method of manufacturing a depletion layer capacitor within an integrated circuit which contains at least one planar transistor, since the masking and diffusion steps correspond to those required in fabricating the planar transistors, and no additional masking, deposition or application and diffusion steps are necessary. It is, however, within the scope of the present invention to use additional steps in cases where specially required electrical values, for example, the breakdown voltage, or in cases where the diffusion of zones of other semiconductor elements or devices is required on the same integrated circuit.

The invention, however, is not limited to monolithic integrated circuits. In fact, it may also be used with discrete depletion layer capacitors, each of which have separate lead-in conductors extending from a housing. In particular, we are referring to devices with glass housings having diameters which are restricted in size so that only a limited semiconductor surface is available which, in turn, at a given operating voltage, sets an upper limit to the obtainable capacity.

What I claim is:

1. A depletion layer capacitor comprising:
a wafer having material of one conductivity type with a first impurity concentration;
said wafer having a layer of opposite conductivity type in an area on one side thereof with a second impurity concentration;
a first region of said opposite conductivity type formed within the surface of said layer, said first region having a higher impurity concentration than said layer;
a second region of said one conductivity type having a higher impurity concentration than said one conductivity type material of said wafer, said second region extending from said one conductivity type material of said wafer into said first region and establishing a PN junction between said first and second regions; and
means around said first and second regions for effectively maintaining said PN junction within said layer and the entire area thereof spaced from the surface of said layer.

2. A depletion layer capacitor according to claim 1 wherein said capacitor is formed within a monolithic integrated circuit, further comprising:
a ring region of the same conductivity type and approximately the same impurity concentration as said second region surrounding said depletion layer capacitor, said ring region extending from said one conductivity type material of said wafer to the surface of said layer for forming an electrical isolation barrier between said depletion layer capacitor and any other electrical components of the monolithic integrated circuit.

3. A depletion layer capacitor according to claim 1 wherein a third region of said opposite conductivity type is formed between said layer and said one conductivity material of said wafer, said third region having a higher impurity concentration than said layer, said third region surrounding said second region.

4. A depletion layer capacitor according to claim 1 wherein said second region is comprised of a stem extending from said one conductivity type material of said wafer to and within said first region, said means comprises a platform having the same conductivity type as said second region and being of lower impurity concentration than said second region, said platform extending further than said stem, and said platform being adjacent said first region.